(12) United States Patent
Wang et al.

(10) Patent No.: US 10,651,405 B2
(45) Date of Patent: May 12, 2020

(54) FLEXIBLE DISPLAY DEVICE AND MANUFACTURING METHOD THEREOF

(71) Applicant: BOE Technology Group Co., Ltd., Beijing (CN)

(72) Inventors: Tao Wang, Beijing (CN); Pao Ming Tsai, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 211 days.

(21) Appl. No.: 15/747,399

(22) PCT Filed: Jul. 20, 2017

(86) PCT No.: PCT/CN2017/093663
§ 371 (c)(1),
(2) Date: Jan. 24, 2018

(87) PCT Pub. No.: WO2018/129900
PCT Pub. Date: Jul. 19, 2018

(65) Prior Publication Data
US 2018/0366661 A1  Dec. 20, 2018

(30) Foreign Application Priority Data

Jan. 13, 2017  (CN) .......................... 2017 1 0026258

(51) Int. Cl.
*H01L 51/52* (2006.01)
*H01L 51/00* (2006.01)
(Continued)

(52) U.S. Cl.
CPC ........ *H01L 51/0097* (2013.01); *H01L 27/323* (2013.01); *H01L 51/0034* (2013.01);
(Continued)

(58) Field of Classification Search
CPC ............. H01L 51/0097; H01L 51/0034; H01L 51/5246
See application file for complete search history.

(56) References Cited

U.S. PATENT DOCUMENTS

2009/0261062 A1  10/2009  Kim
2014/0243444 A1*  8/2014  Ikari .................... C08F 299/00
522/28
(Continued)

FOREIGN PATENT DOCUMENTS

CN  102223752 A  10/2011
CN  202433654 U  9/2012
(Continued)

OTHER PUBLICATIONS

Sep. 22, 2017—(WO) International Search Report and Written Opinion Appn PCT/CN2017/093663 with English Tran.
(Continued)

*Primary Examiner* — Douglas M Menz
(74) *Attorney, Agent, or Firm* — Banner & Witcoff, Ltd.

(57) ABSTRACT

A flexible display device and a manufacturing method thereof are provided. The flexible display device includes a flexible display panel and a function module, the function module includes a base film and a function layer formed on the base film, and the base film is served as an adhesive layer to attach the function module to the flexible display panel.

17 Claims, 3 Drawing Sheets

(51) Int. Cl.
*H01L 51/56* (2006.01)
*H01L 27/32* (2006.01)

(52) U.S. Cl.
CPC ...... *H01L 51/5246* (2013.01); *H01L 51/5253* (2013.01); *H01L 51/56* (2013.01)

(56) References Cited

U.S. PATENT DOCUMENTS

| | | | |
|---|---|---|---|
| 2015/0029681 A1* | 1/2015 | Mack | H01L 31/03926 361/748 |
| 2015/0125679 A1* | 5/2015 | Ishikawa | C23C 16/402 428/216 |
| 2015/0200375 A1* | 7/2015 | Kim | G09F 9/301 257/40 |
| 2015/0253487 A1* | 9/2015 | Nichol | G02B 6/0036 362/610 |
| 2016/0020226 A1 | 1/2016 | Cheng et al. | |
| 2017/0051093 A1* | 2/2017 | Ikari | C08F 8/26 |

FOREIGN PATENT DOCUMENTS

| | | |
|---|---|---|
| CN | 202794791 U | 3/2013 |
| CN | 103681694 A | 3/2014 |
| CN | 204087154 U | 1/2015 |
| CN | 104779266 A | 7/2015 |
| CN | 205508290 U | 8/2016 |
| CN | 106558279 A | 4/2017 |
| JP | 2007288148 A | 11/2007 |
| TW | M520165 U | 4/2016 |

OTHER PUBLICATIONS

Oct. 9, 2018—(CN) First Office Action Appn 201710026258.2 with English Translation.

* cited by examiner

FLEXIBLE DISPLAY DEVICE AND MANUFACTURING METHOD THEREOF

CROSS REFERENCE TO RELATED APPLICATION

The application is a U.S. National Phase Entry of International Application No. PCT/CN2017/093663, designating the United States of America and claiming priority to Chinese Patent Application No. 201710026258.2, filed Jan. 13, 2017. The present application claims priority to and the benefit of the above-identified applications and the above-identified applications are incorporated by reference herein in their entirety.

TECHNICAL FIELD

Embodiments of the present disclosure relate to a flexible display device and a manufacturing method thereof.

BACKGROUND

Flexible display panels have gradually become the mainstream of the display field because of their following advantages: light and thin, bendable, capable of being amounted on an irregular surface, and capable of being made to a wearable device etc. The flexible display panel can achieve foldable display by a liquid crystal display (LCD) or an organic light-emitting diode (OLED). In the display technology for realizing flexible display, the OLED has become a research hotspot in the flexible display field in recent years, because it has excellent performances, such as self-luminescent, fast response, wide viewing angle, high brightness, low power consumption, and easier to be bent with a smaller bending radius etc. Meanwhile, with the development of technologies such as touch control technology and fingerprint recognition technology etc., function modules have been widely applied to various electronic products and are gradually extended to wearable devices. Currently, the flexible display device which integrates the function module with the flexible display panel has attracted widespread attentions.

SUMMARY

The embodiments of the disclosure provide a flexible display device and a manufacturing method thereof, which can reduce a thickness of the flexible display device.

At least one embodiment of the disclosure provides a flexible display device, comprising a flexible display panel and a function module, wherein the function module comprises a base film and a function layer formed on the base film, and the base film is served as an adhesive layer to attach the function module to the flexible display panel.

According to the flexible display device provided by an embodiment of the disclosure, the base film is a hot melt adhesive film.

According to the flexible display device provided by an embodiment of the disclosure, the hot melt adhesive film is styrene-propylene copolymer, cycloolefin copolymer, cycloolefin polymer or polystyrene.

According to the flexible display device provided by an embodiment of the disclosure, an optical transmittance of the hot melt adhesive film is larger than or equal to 90%.

According to the flexible display device provided by an embodiment of the disclosure, the base film is heat meltable and comprises a hot melt layer, and the hot melt layer is capable of being processed into a molten or molten adhesive state and served as an adhesive layer to attach the function module to the flexible display panel.

According to the flexible display device provided by an embodiment of the disclosure, the base film further comprises a stable layer, the stable layer is more away from the flexible display panel than the hot melt layer and the function layer is on the stable layer.

According to the flexible display device provided by an embodiment of the disclosure, the hot melt layer is a portion of the base film, and the hot melt layer and the stable layer are of an integral structure.

According to the flexible display device provided by an embodiment of the disclosure, a thickness of the stable layer is larger than a thickness of the hot melt layer.

According to the flexible display device provided by an embodiment of the disclosure, the hot melt layer has a thickness ranging from one sixth to one fourth of a thickness of the stable layer.

According to the flexible display device provided by an embodiment of the disclosure, the hot melt layer has a thickness ranging from three to five times of a complete flat step difference of a surface of the base film to be attached, the surface of the base film to be attached is formed after the base film is heated and melted, and before the base film is attached.

According to the flexible display device provided by an embodiment of the disclosure, the function layer is a touch function layer, a fingerprint recognition layer or a protection function layer.

At least one embodiment of the disclosure provides a manufacturing method of a flexible display device, comprising:

processing at least a portion of a base film into a molten or molten adhesive state to form a pre-adhesive layer; and attaching a side of the base film where the pre-adhesive layer is formed to a flexible display panel.

According to the manufacturing method of the flexible display device provided by an embodiment of the disclosure, the base film is a hot melt adhesive film.

According to the manufacturing method of the flexible display device provided by an embodiment of the disclosure, forming the pre-adhesive layer comprises: heating the base film so that at least a portion thereof is hot-melted into a hot molten layer, and the hot molten layer is the pre-adhesive layer.

According to the manufacturing method of the flexible display device provided by an embodiment of the disclosure, the base film further comprises a portion which is not heated and melted, the portion which is not heated and melted is a stable layer, and the stable layer is more away from the flexible display panel than the hot melt layer.

According to the manufacturing method of the flexible display device provided by an embodiment of the disclosure, before heating the base film, the manufacturing method further comprises forming a function layer on a side of the stable layer away from the hot molten layer to form a function module.

According to the manufacturing method of the flexible display device provided by an embodiment of the disclosure, after heating the base film, the manufacturing method further comprises forming a function layer on a side of the stable layer away from the hot molten layer to form a function module.

According to the manufacturing method of the flexible display device provided by an embodiment of the disclosure, a thickness of the stable layer is larger than a thickness of the hot molten layer.

According to the manufacturing method of the flexible display device provided by an embodiment of the disclosure, the hot molten layer has a thickness ranging from one sixth to one fourth of a thickness of the stable layer.

According to the manufacturing method of the flexible display device provided by an embodiment of the disclosure, the hot molten layer has a thickness ranging from three to five times of a complete flat step difference of a surface of the base film to be attached, the surface of the base film to be attached is formed after the base film is heated and melted, and before the base film is attached.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

According to research, inventor(s) of the present application found that a thickness of an adhesive material which is configured to attach a flexible display panel and a function module is usually 150 μm to 250 μm, which is about 10% to 35% of a thickness of the function module. If there are special needs, the thickness of the adhesive material will be larger, and thus the flexible display device formed by a conventional manner has a thick structure as a whole and a poor bending property, and the adhesive material will degrade the bending property. Further, the manufacturing process of the conventional flexible display device needs many times of attaching processes, which reduces production yield rate in some extent.

Figure 1:
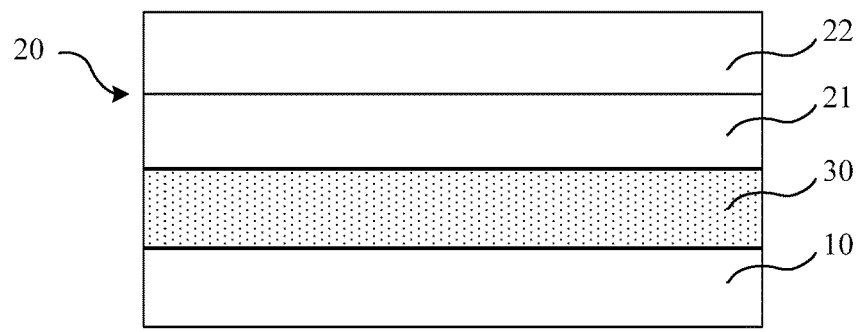
FIG. 1 is a schematic structural diagram of a flexible display device.

FIG. 1 is a schematic structural diagram of a conventional flexible display device. As illustrated in FIG. 1, a main body structure of the conventional flexible display device includes a flexible display panel 10 and a function module 20. The function module 20 includes a base film 21 and a function layer 22, and the flexible display panel 10 and the function module 20 are attached together by an adhesive material 30. A manufacturing process of the conventional flexible display device is: firstly forming a function layer 22 on a top surface of a base film 21 to form a function module 20, then attaching an adhesive material 30 to a top surface of the flexible display panel 10 or a bottom surface of the base film 21 so as to attach the bottom surface of the base film 21 to the flexible display panel 10 to form a flexible display device. In addition, in order to protect the flexible display panel and enhance the convenience in use, a surface of the flexible display panel is usually covered with some protection films. For example, a process of covering a protection film is usually that attaching an adhesive material to a surface of the protection film or to a top surface of the flexible display panel, and then attaching the protection film to the flexible display panel so as to form the flexible display device.

Figure 2:
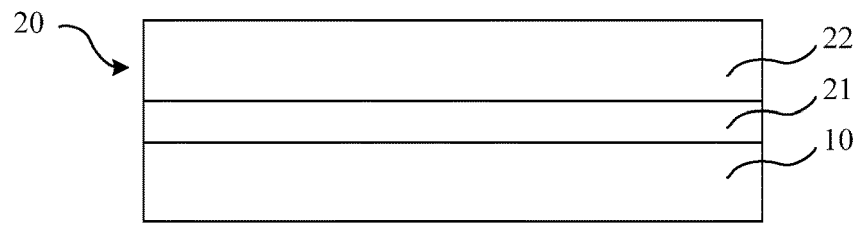
FIG. 2 is a schematic structural diagram of a flexible display device according to an embodiment of the disclosure.

FIG. 2 is a schematic structural diagram of a flexible display device according to an embodiment of the disclosure. In view of at least one of drawbacks, such as thicker overall structure, poor bending property, and lower production yield rate during the manufacturing process, etc., which the conventional flexible display device has, the embodiment of the disclosure provides a flexible display device. As illustrated in FIG. 2, the flexible display device includes a flexible display panel 10 and a function module 20, the function module 20 includes a base film 21 and a function layer 22 formed on the base film 21, and the base film 21 can be served as an adhesive layer to attach the function module 20 to the flexible display panel 10. In the embodiment of the disclosure, the function module is directly integrated with the flexible display panel by using the base film of the function module as an adhesive layer, thereby reducing a thickness of the flexible display device, improving the bending property and/or increasing the yield rate, thus effectively overcoming at least one of the above-mentioned drawbacks of the conventional technology.

In the specific implementation, the flexible display panel provided by the embodiments of the disclosure can be implemented in various manners, and several specific implementations will be illustrated below as examples.

Figure 3:
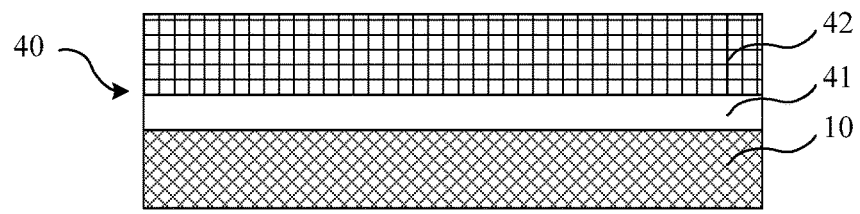
FIG. 3 is a schematic structural diagram of a flexible display device according to a first embodiment of the disclosure.

FIG. 3 is a schematic structural diagram of a flexible display device provided by an embodiment of the disclosure. As illustrated in FIG. 3, a main body structure of the flexible display device provided by the embodiment of the disclosure includes a flexible display panel 10 and a touch function module 40, the touch function module 40 includes a base film 41 and a touch function layer 42 formed on the base film 41, and the base film 41 is served as an adhesive layer to attach the touch function module 40 to the flexible display panel 10. For example, the base film 41 of the embodiment can have a dual function, on one hand, being served as a base substrate on which a patterned touch function layer is manufactured, because of good optical property of the base film, on the other hand, being served as an adhesive layer for attachment, because of hot melt property of the base film which is being transformed into a molten or molten adhesive state after being heated, thereby directly integrating the function module 40 with the flexible display panel 10.

In the embodiment, the base film 41 is a hot melt adhesive film (a hot melt film) having a good optical property and a hot melt property, a material of the base film can be styrene-propylene copolymer, cycloolefin copolymer, cycloolefin polymer or polystyrene, etc. For example, the hot melt adhesive film can have a good water and oxygen blocking property, an optical transmittance of the hot melt adhesive film can be above 90%, a tensile elongation of the hot melt adhesive film can be above 200%, a young modulus of the hot melt adhesive film can be smaller than 1 Gpa, a coefficient of thermal expansion (CTE) of the hot melt adhesive film can be larger than 80 ppm/° C., a peel strength of the hot melt adhesive film can be larger than 5 N/inch, and a retardation of the hot melt adhesive film can be 5 nm. For example, the hot melt adhesive film can be a soft (flexible) film, i.e. the base film 41 can be a hot melt soft film.

Figure 4A:
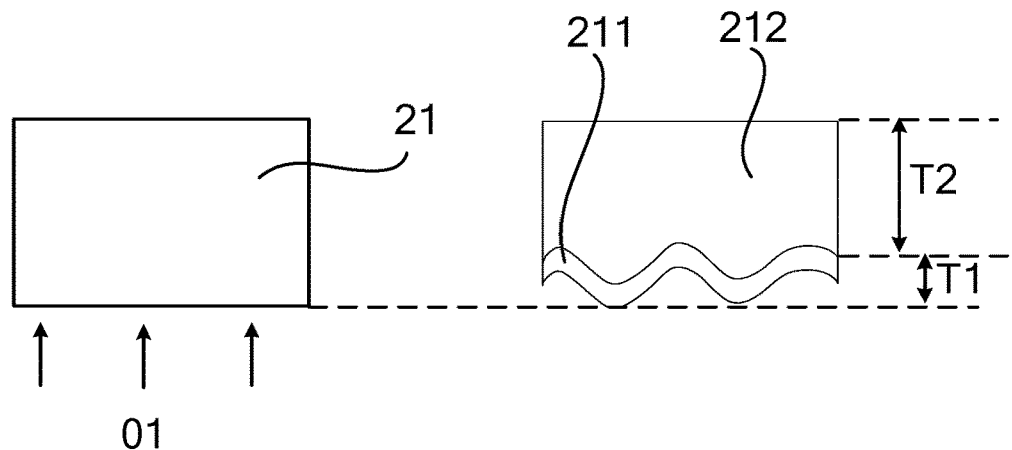
FIG. 4A is a schematic diagram of heating a surface of a hot melt adhesive film according to an embodiment of the disclosure.

FIG. 4A is a schematic diagram of heating a surface of a hot melt adhesive film provided by an embodiment of the disclosure. In the embodiment, the base film 21 includes a hot molten layer 211 and a stable layer 212. The stable layer 212 can be configured to form a function layer on a surface thereof, and the hot molten layer 211 can be configured to be processed into a molten or molten adhesive state, and can be served as a pre-adhesive layer for being attached. For example, a surface of the base film 21 can be heated by a heat source so that at least a portion of the hot melt adhesive film is hot melted to form the hot molten layer 211. For example, in the embodiment, in order to make a side of the hot melt layer which is attached to the flexible display panel into the molten or molten adhesive state and the stable layer on which a touch function layer is formed to remain an original rigidity, a thickness T2 of the stable layer 212 can be larger than a thickness T1 of the hot molten layer 211. For example, the thickness T1 of the hot molten layer 211 can range from one sixth to one fourth of the thickness T2 of the stable layer 212. For example, the thickness T1 of the hot molten layer 211 can be one fifth of the thickness T2 of the stable layer 212. For example, when the base film is heated, the hot melt layer is made into a molten or molten adhesive state, but the stable layer has no state change to remain an original rigidity. For example, for a hot melt adhesive film with a thickness of 120 μm, a thickness of the hot melt layer can be smaller than 20 μm, and a thickness of the stable layer can be larger than or equal to 100 μm. When a surface of a side of the base film where the hot melt layer is located is heated, only the hot melt layer with a thickness of 20 μm is in a molten or molten adhesive state, and the stable layer with a thickness of 100 μm and with no state change remains an original rigidity.

Figure 4B:
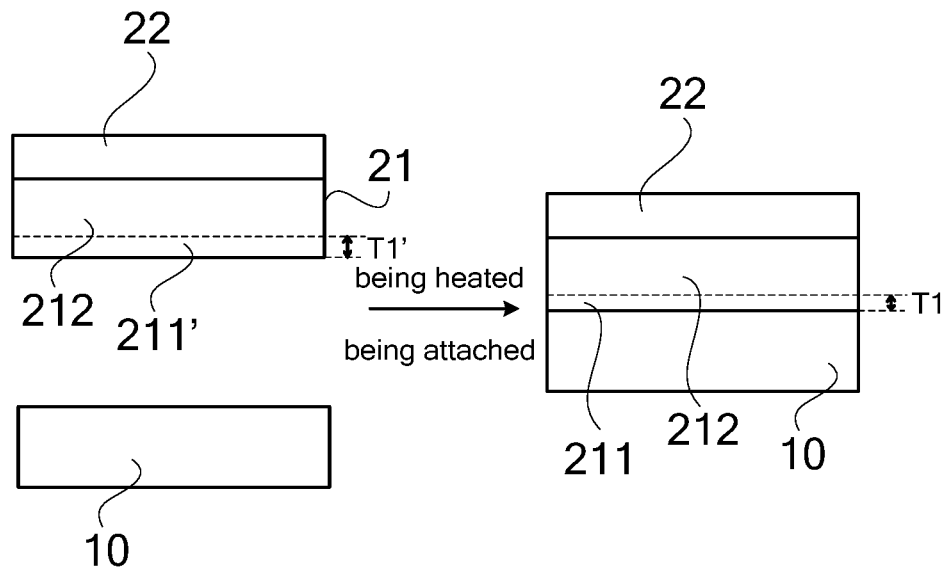
FIG. 4B is a schematic diagram of a thickness of a hot melt adhesive film after being heated being thinner than that of the hot melt adhesive film before being heated according to an embodiment of the disclosure.

For example, when the surface of the hot melt layer is heated, because the heated surface is changed into a liquid or colloid form having fluidity, a thickness of the hot melt layer which is in a molten or molten adhesive state after being heated will be smaller than an original thickness of the hot melt layer before being heated. In a general case, as illustrated in FIG. 4B, a thickness T1 of the hot molten layer 211 which is in a molten or molten adhesive state is 80% to 90% of a thickness T1' of the hot melt layer 211' which is before being heated. Thus, the thickness of the display device can be further reduced. For example, the thickness of the stable layer 212 does not change before and after being heated.

When being implemented in practice, a thickness H of the hot melt layer can be equal to 3h to 5h, wherein h refers to a complete flat step difference of a surface of the hot melt adhesive film, the surface of the hot melt adhesive film is a surface of the base film to be attached, and the surface of the base film to be attached is formed after the base film is heated and melted, and before the base film is attached. The complete flat step difference is a parameter representing smoothness of the surface of the hot melt adhesive layer. The complete flat step difference is generally a sum of a maximum height of a surface protrusion and a maximum depth of a surface cavity. For example, the thickness H of the hot melt layer is equal to 4h.

The technical solution of the embodiment is further described below by a manufacturing process of the flexible display device.

Figure 5:
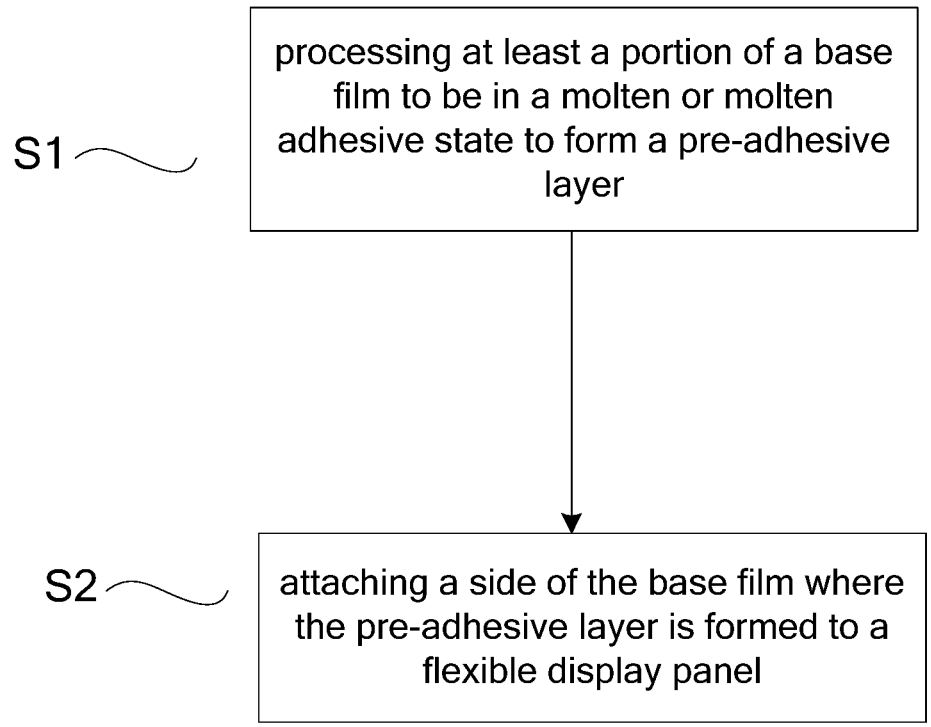
FIG. 5 is a flow chart of a manufacturing method according to an embodiment of the disclosure.

FIG. 5 is a flow chart of a manufacturing method according to an embodiment of the disclosure. As illustrated in FIG. 5, the manufacturing method of the flexible display device provided by the embodiment includes:

S1. processing at least a portion of a base film into a molten or molten adhesive state to form a pre-adhesive layer;

S2. attaching a side of the base film where the pre-adhesive layer is formed to a flexible display panel.

For example, in the embodiment, the base film can adopt a hot melt adhesive film having a good optical property and a hot melt property. Because of the good optical property of the hot melt adhesive film, the hot melt adhesive film is served as a base substrate for forming a patterned touch function layer. And because of the physical property of the hot melt adhesive film which is being transformed into a molten or molten adhesive state after being heated, the hot melt adhesive film is served as a pre-adhesive layer so as to be attached to the flexible display panel. For example, the base film can include a hot melt layer and a stable layer, the stable layer can be configured to form a function layer on a surface thereof, and the hot melt layer can be configured to be processed into a molten or molten adhesive state and be served as an adhesive layer for being attached.

In the embodiment, there are many ways in which a flexible display device can be formed. For example, a touch function layer is firstly formed on a base film to form a touch module, and then a pre-adhesive layer is formed by heating and hot-melting at least a portion of the base film to attach the touch module to the flexible display panel. For another example, a pre-adhesive layer is firstly formed by heating and hot-melting at least a portion of the base film to attach the base film to the flexible display panel, and then a touch function film is formed on the base film.

The two implementations will be detailed below.

For the implementation of firstly forming the touch function layer on the base film to form the touch module, step S1 of the flow as illustrated in FIG. 5 includes following steps.

S101. forming the touch function layer on a surface of a stable layer of the base film to form the function module;

S102. heating a hot melt layer of the base film so that the hot melt layer is processed into a molten or molten adhesive state to be served as a pre-adhesive layer.

Step S2 includes following steps.

S201. attaching a hot molten layer which is in a molten or molten adhesive state to the flexible display panel, to form the flexible display device.

For the implementation of forming the touch function layer on the base film, step S1 of the flow as illustrated in FIG. 5 includes following steps.

S111. heating a hot melt layer of the base film, so that the hot melt layer is processed into a molten or molten adhesive state to be served as a pre-adhesive layer.

Step S2 includes following steps.

S211. attaching the hot molten layer which is in a molten or molten adhesive state to the flexible display panel;

S212. forming the function layer on a stable layer of the base film, to form the flexible display device.

When the surface of the hot melt adhesive layer is heated, as above-mentioned, only the hot melt layer of the hot melt adhesive film is changed into the molten or molten adhesive state, i.e. only the hot melt layer is processed to have the liquid or colloid form having fluidity, by controlling a heating temperature and a heating time. When being attached, the hot melt layer which is in the molten or molten adhesive state is pressed on the flexible display panel, and after the hot molten layer is cooled, tightly attachment of the hot melt adhesive film and the flexible display panel is achieved.

The hot melt adhesive layer having good optical property and hot melt property is employed by the embodiment. The hot melt adhesive film is not only served as a base substrate for forming the touch function layer, but also served as an adhesive layer for being attached to the flexible display panel, so as to directly integrate the touch module with the flexible display panel, thereby significantly reducing the overall thickness of the flexible display device. For example, for a conventional touch module with a thickness of about 1000 μm, when the flexible display device is formed by a conventional manner, a thickness of "the touch module plus the adhesive material" is larger than 1200 μm. By adopting the solution of the embodiment, the adhesive material as conventional manner used is omitted, and partial thickness of the base film is consumed when being attached, so that the thickness of the touch module is smaller than 1000 μm, and the thickness is only 80% of the thickness in conventional manner, i.e. the thickness is reduced by 20%.

In the embodiment, the touch function layer can include a touch electrode layer and a protection layer. The touch electrode layer can be a single transparent conductive sensor (e.g. ITO sensor) layer on which a touch scan electrode Tx pattern and a touch sense electrode Rx pattern are provided, and a pattern of the protection layer can be formed by a patterning process. For example, the touch function layer can further include a polarization layer, a flexible circuit layer etc., and other structures can also be adopted, which will not be particularly defined. The flexible display panel can be an OLED display panel, including a base substrate and display devices formed on the base substrate. The display devices usually include a thin film transistor (TFT) device, an organic light-emitting material layer and an encapsulation protection layer. The TFT device is provided on the base substrate, the light-emitting material layer is provided on the TFT device, and the encapsulation protection layer is provided on the organic light-emitting material layer. For example, the OLED display panel can also adopt other structures, and can also include other film layers, which will not be particular limited herein. For example, the flexible display device provided by the embodiment can be any productions and components having the display function, such as a cell phone, a tablet, a TV set, a display, a notebook, a digital frame, and a navigator etc.

Figure 6:
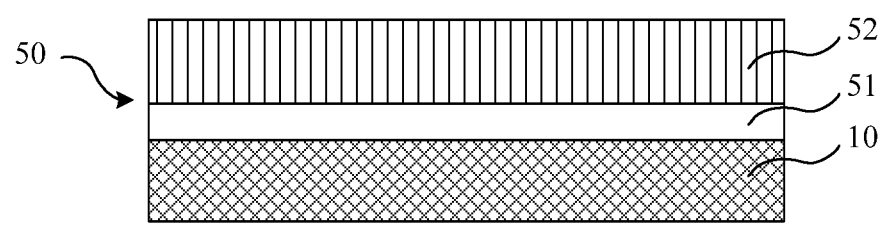
FIG. 6 is a schematic structural diagram of a flexible display device according to an embodiment of the disclosure.

FIG. 6 is a schematic structural diagram of a flexible display device provided by another embodiment of the disclosure. As illustrated in FIG. 6, a main body structure of the flexible display device of the embodiment includes a flexible display panel 10 and a fingerprint recognition module 50, the fingerprint recognition module 50 can include a base film 51 and a fingerprint recognition function layer 52, and the base film 51 is served as an adhesive layer to attach the fingerprint recognition module 50 to the flexible display panel 10. For example, the base film 51 of the embodiment has a dual function, on one hand, being served as a base substrate on which a patterned fingerprint recognition function layer is manufactured, because of good optical property of the base film, on the other hand, being served as an adhesive layer for attachment, because of hot melt property of the base film which is being transformed into a molten or molten adhesive state after being heated, thereby directly integrating the fingerprint function module 50 with the flexible display panel 10.

In the embodiment, the base film 51 is a hot melt adhesive film having a good optical property and a hot melt property, a material of the base film can be styrene-propylene copolymer, cycloolefin copolymer, cycloolefin polymer or polystyrene etc. The related properties, the structure, the manner of being attached to the flexible display panel and the manufacturing method of the hot melt adhesive film can refer to above-mentioned embodiments, which will not be repeated herein.

In the embodiment, the fingerprint recognition function layer can include a plurality of fingerprint recognition units arranged in an array on the hot melt adhesive film, and each of the fingerprint recognition units can include a lower electrode, an upper electrode and a photocurrent generating unit connected the lower electrode with the upper electrode and disposed between the lower electrode and the upper electrode. For example, the fingerprint recognition function layer can further include other film layers and can also adopt other structures, which will not be limited herein. The flexible display panel can refer to the above-mentioned embodiments.

Figure 7:
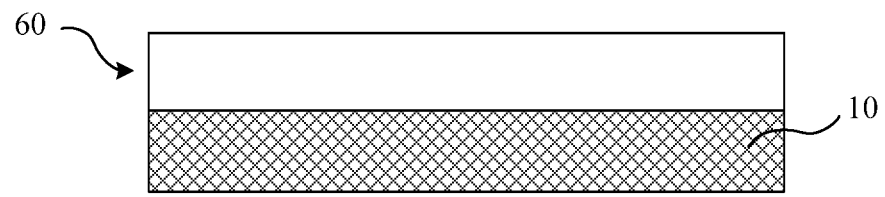
FIG. 7 is a schematic structural diagram of a flexible display device according to an embodiment of the disclosure.

FIG. 7 is a schematic structural diagram of a flexible display device provided by another embodiment of the disclosure. As illustrated in FIG. 7, a main body structure of the flexible display device of the embodiment includes a flexible display panel 10 and a protection module 60, the protection module 60 includes a base film and a protection function layer, and the base film is served as an adhesive layer to attach the protection module 60 to the flexible display panel 10. For example, the base film of the embodiment has a dual function, on one hand, being served as a base substrate on which a protection function layer is manufactured, because of good optical property of the base film, on the other hand, being served as an adhesive layer for attachment, because of hot melt property of the base film which is being transformed into a molten or molten adhesive state after being heated, thereby directly integrating the protection module 60 with the flexible display panel 10. In the embodiment, the protection module can be a protection function layer which is separately formed on the base film, and the protection function layer and the base film can also be of an integral structure (formed integrally, of a one-piece structure).

In the embodiment, the base film is a hot melt adhesive film having a good optical property and a hot melt property, a material of the base film can be styrene-propylene copolymer, cycloolefin copolymer, cycloolefin polymer or polystyrene etc. The related properties, the structure, the manner of attaching to the flexible display panel and the manufacturing method of the hot melt adhesive film can refer to above-mentioned embodiments, which will not be repeated herein. When the protection function layer and the base film are of a separate structure, the protection function layer is a protection film, an antiskid film or a hardness film etc., which is formed on the hot melt adhesive film. When the protection function layer and the base film are of an integral structure, the protection function layer is formed by processing a surface of the hot melt adhesive film, which will not be limited herein. The flexible display panel can be an OLED display panel, and the OLED display panel can refer to the above-mentioned embodiments.

For example, in the embodiments of the present disclosure, the hot melt layer is a portion of the base film (a hot melt portion), and the stable layer is a portion of the base film (a stable portion). For example, the hot melt portion and the stable portion are of an integral structure (formed integrally).

For example, the stable portion is not heated and melted, and the stable portion is away from the surface of the base film being processed. For example, the portion of the base film being processed is a molten portion. For example, a thickness of the stable portion is larger than a thickness of the portion of the base film being processed.

For example, the portion of the base film being processed has a thickness ranging from one sixth to one fourth of a thickness of the stable portion. For example, the portion of the base film being processed has a thickness ranging from three to five times of a complete flat step difference of a surface of the base film to be attached, the surface of the base film to be attached is formed after the base film is heated and melted, and before the base film is attached.

For example, in the embodiments of the present disclosure, before being processed, the hot melt adhesive film is in a solid state, and after being processed, the hot melt adhesive film becomes into a molten state. For example, being processed includes being heated. For example, after being cooled, the hot melt adhesive film in a molten state becomes into a solid state again. For example, a molten state includes a molten adhesive state.

The above-mentioned embodiments provide a flexible display device with a novel structure which employs a hot melt adhesive film as a base film, and the hot melt adhesive film has a hot melt property, an attaching property and a good optical property. The hot melt adhesive film is not only served as a base substrate for forming a function layer, but also served as an adhesive layer for being attached to the flexible display panel so as to directly integrate the function module with the flexible display panel. On one hand, an overall thickness of the flexible display device is reduced and the flexural property is improved, on the other hand, use of the separate adhesive material for being attached is reduced, thereby facilitating to improve the production yield rate. The technical solutions provided by the embodiments of the disclosure, not only realize a lighter and thinner flexible touch panel, but also enable a flexible touch panel to have a better bending ability, realize various forms of bending shapes and facilitate to improve mechanical properties of respective function film layers during bending.

For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or an intermediate component or element is interposed therebetween.

In case of no conflict, different features in one embodiment or features in different embodiments can be combined.

What are described above is the embodiments of the disclosure only and not limitative to the scope of the disclosure; any of those skilled in related arts can easily conceive variations and substitutions in the technical scopes disclosed by the disclosure, which should be encompassed in protection scopes of the disclosure. Therefore, the scopes of the disclosure should be defined in the appended claims.

The invention claimed is:

1. A display device, comprising a display panel and a function module, wherein the function module comprises a base film and a function layer located on the base film, and the function module is attached to the display panel by the base film,
   wherein the base film is heat meltable, the base film comprises a hot melt portion and a stable portion, and a thickness of the stable portion is larger than a thickness of the hot melt portion,
   wherein the hot melt portion is capable of being processed into a molten state to attach the function module to the display panel, and the stable portion is located at a side of the hot melt portion away from the display portion, and the function layer is on the stable portion.

2. The display device according to claim 1, wherein the base film is in close contact with the display panel.

3. The display device according to claim 1, wherein the hot melt portion has a thickness ranging from three times of a complete flat step difference of a surface of the base film to be attached to five times of the complete flat step difference of the surface of the base film to be attached, the surface of the base film to be attached is formed after the base film is heated and melted, and before the base film is attached.

4. The display device according to claim 1, wherein the hot melt portion and the stable portion are of an integral structure.

5. The display device according to claim 1, wherein the hot melt portion has a thickness ranging from one sixth of a thickness of the stable portion to one fourth of the thickness of the stable portion.

6. The display device according to claim 1, wherein the base film is a hot melt adhesive film.

7. The display device according to claim 6, wherein the hot melt adhesive film comprises at least one selected from the group consisting of styrene-propylene copolymer, cycloolefin copolymer, cycloolefin polymer, and polystyrene.

8. The display device according to claim 1, wherein an optical transmittance of the hot melt adhesive film is larger than or equal to 90%.

9. The display device according to claim 1, wherein the display panel is a flexible display panel.

10. A manufacturing method of a display device, comprising:

provurability a base film, the base film being heat meltable, the base film comprising a hot melt portion and a stable portion, a thickness of the stable portion being larger than a thickness of the hot melt portion;

processing a portion of the base film into a molten state to form a molten portion, the portion of the base film being the hot melt portion; and attaching a side of the base film where the molten portion is located to a display panel.

11. The manufacturing method according to claim 10, further comprising cooling the molten portion into a solid state.

12. The manufacturing method according to claim 11, wherein the processing the portion of the base film into the molten state to form the molten portion comprises: heating a surface of the base film so that a portion thereof is melted into the molten state to form the molten portion.

13. The manufacturing method according to claim 12, wherein the base film further comprises a stable portion, the stable portion is not heated and melted.

14. The manufacturing method according to claim 12, before heating the base film, further comprising forming a function layer on a side of the base film away from the surface of the base film which is to be heated, to form a function module.

15. The manufacturing method according to claim 12, after cooling the molten portion into the solid state, further comprising forming a function layer on a side of the base film away from the display panel.

16. The manufacturing method according to claim 13, wherein a thickness of the stable portion is larger than a thickness of the portion of the base film being processed.

17. The manufacturing method according to claim 10, wherein the base film is a hot melt adhesive film.

* * * * *